(12) United States Patent
Saxena et al.

(10) Patent No.: US 7,932,105 B1
(45) Date of Patent: Apr. 26, 2011

(54) SYSTEMS AND METHODS FOR DETECTING AND MONITORING NICKEL-SILICIDE PROCESS AND INDUCED FAILURES

(75) Inventors: Sharad Saxena, Richardson, TX (US);
Jae-Yong Park, Frisco, TX (US);
Benjamin Shieh, Sunnyvale, CA (US);
Mark Spinelli, Midlothian, VA (US);
Shiying Xiong, Santa Clara, CA (US);
Hossein Karbasi, San Diego, CA (US)

(73) Assignee: PDF Solutions, San Jose, CA (US)

( * ) Notice: Subject to any disclaimer, the term of this patent is extended or adjusted under 35 U.S.C. 154(b) by 87 days.

(21) Appl. No.: 12/251,127

(22) Filed: Oct. 14, 2008

Related U.S. Application Data

(60) Provisional application No. 60/998,637, filed on Oct. 12, 2007.

(51) Int. Cl.
*H01L 21/66* (2006.01)

(52) U.S. Cl. ............. 438/17; 438/14; 438/10; 438/917; 438/233; 257/E21.521; 257/E21.52; 257/E21.526; 257/E21.531

(58) Field of Classification Search .................... 438/14, 438/17, 10, 917, 233; 257/E21.521, E21.525, 257/E21.526, E21.531
See application file for complete search history.

(56) References Cited

U.S. PATENT DOCUMENTS

| | | | |
|---|---|---|---|
| 6,049,213 A * | 4/2000 | Abadeer | 324/719 |
| 2006/0172443 A1 * | 8/2006 | Ramappa | 438/14 |

* cited by examiner

*Primary Examiner* — Ngan Ngo
*Assistant Examiner* — Benjamin Tzu-Hung Liu

(57) ABSTRACT

Systems and methods for detecting and monitoring Nickel-silicide process and induced failures. In a first method embodiment, a method of characterizing a Nickel-silicide semiconductor manufacturing process includes accessing a test chip including a parallel coupled chain of transistors, wherein the transistors are designed for inducing stress into Nickel-silicide features of the transistors, and for increasing a probability of a manufacturing failure of the Nickel-silicide features. A biasing voltage is applied to one terminal of the parallel coupled chain, all other terminals of the parallel coupled chain and grounded, and current is measured at each of the all other terminals of the parallel coupled chain. This process is repeated for each terminal of the parallel coupled chain. The measured currents from all possible conduction paths are compared to determine a manufacturing defect in the parallel coupled chain of transistors.

8 Claims, 12 Drawing Sheets

| Means N= | Forced Voltage (NMOS) | | | | | | Sensed |
|---|---|---|---|---|---|---|---|
| | G | F | W | D_S | D | S | |
| Gld_s | "+" | 0 | 0 | 0 | 0 | 0 | D_S |
| Glw | "+" | 0 | 0 | 0 | 0 | 0 | W |
| Glf | "+" | 0 | 0 | 0 | 0 | 0 | F |
| Glg | "+" | 0 | 0 | 0 | 0 | 0 | G |
| Flg | 0 | "+" | 0 | 0 | 0 | 0 | G |
| Fld_s | 0 | "+" | 0 | 0 | 0 | 0 | D_S |
| Flw | 0 | "+" | 0 | 0 | 0 | 0 | W |
| Flf | 0 | "+" | 0 | 0 | 0 | 0 | F |
| Wlg | 0 | 0 | "+" | 0 | 0 | 0 | G |
| Wld_s | 0 | 0 | "+" | 0 | 0 | 0 | D_S |
| Wlf | 0 | 0 | "+" | 0 | 0 | 0 | F |
| Wlw | 0 | 0 | "+" | 0 | 0 | 0 | W |
| Dls | 0 | 0 | 0 | 0 | "+" | 0 | S |
| Dlg | 0 | 0 | 0 | 0 | "+" | 0 | G |
| Dlw | 0 | 0 | 0 | 0 | "+" | 0 | W |
| Dlf | 0 | 0 | 0 | 0 | "+" | 0 | F |
| Dld | 0 | 0 | 0 | 0 | "+" | 0 | D |
| Sld | 0 | 0 | 0 | 0 | 0 | "+" | D |
| Slg | 0 | 0 | 0 | 0 | 0 | "+" | G |
| Slw | 0 | 0 | 0 | 0 | 0 | "+" | W |
| Slf | 0 | 0 | 0 | 0 | 0 | "+" | F |
| Sls | 0 | 0 | 0 | 0 | 0 | "+" | S |

SYSTEMS AND METHODS FOR DETECTING AND MONITORING NICKEL-SILICIDE PROCESS AND INDUCED FAILURES

RELATED APPLICATION

This Application claims priority to U.S. Provisional Application No. 60/998,637, filed Oct. 12, 2007, entitled "Systems and Methods for Detecting and Monitoring Nickel-Silicide Process and Induced Failures" to Saxena et al., which is incorporated herein in its entirety by reference for all purposes.

FIELD OF INVENTION

The present invention relates to systems and methods of integrated circuit manufacturing and test. More specifically, embodiments in accordance with the present invention are related to systems and methods for detecting and monitoring Nickel-silicide processes and induced failures.

BACKGROUND OF THE INVENTION

Silicidation is a common and frequently employed process in modern complementary metal oxide semiconductor (CMOS) manufacturing, e.g., to decrease contact resistance. Nickel silicide (NiSi) is often the material of choice for silicidation in nanometer scale technologies (e.g., with a critical dimension of 65 nm or less). However, the use of NiSi may introduce a variety of process complications and failure modes, e.g., increased or deleterious leakage, that can impact both the performance and yield of integrated circuits. Moreover, some silicidation defects may occur below a layer of silicon and are thus invisible to conventional optical inspection techniques.

SUMMARY OF THE INVENTION

Therefore, a need exists for systems and method for detecting and monitoring Nickel-silicide processes and induced failures. A need also exists for systems and methods for integrated circuit structures with increased probability of Nickel-silicide failures, which also satisfies the above need. An additional need also exists for systems and methods for detecting Nickel-silicide failures on an integrated circuit, which also satisfies the above needs. A further need exists for systems and method for detecting and monitoring Nickel-silicide process and induced failures that are compatible and complementary with existing systems and methods of multi-layer photolithographic manufacturing and test of semiconductors. Embodiments in accordance with the present invention provide for these needs.

Accordingly, systems and methods for detecting and monitoring Nickel-silicide process and induced failures are disclosed. In a first method embodiment, a method of characterizing a Nickel-silicide semiconductor manufacturing process includes accessing a test chip including a parallel coupled chain of transistors, wherein the transistors are designed for inducing stress into Nickel-silicide features of the transistors, and for increasing a probability of a manufacturing failure of the Nickel-silicide features. A biasing voltage is applied to one terminal of the parallel coupled chain, all other terminals of the parallel coupled chain are grounded, and current is measured at each of the other terminals of the parallel coupled chain. This process is repeated for each terminal of the parallel coupled chain. The measured currents from all possible conduction paths are compared to determine a manufacturing defect in the parallel coupled chain of transistors.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein:

FIG. 7B illustrates a configuration table of measured currents versus biased terminal, in accordance with embodiments of the present invention.

DETAILED DESCRIPTION

Figure 1:
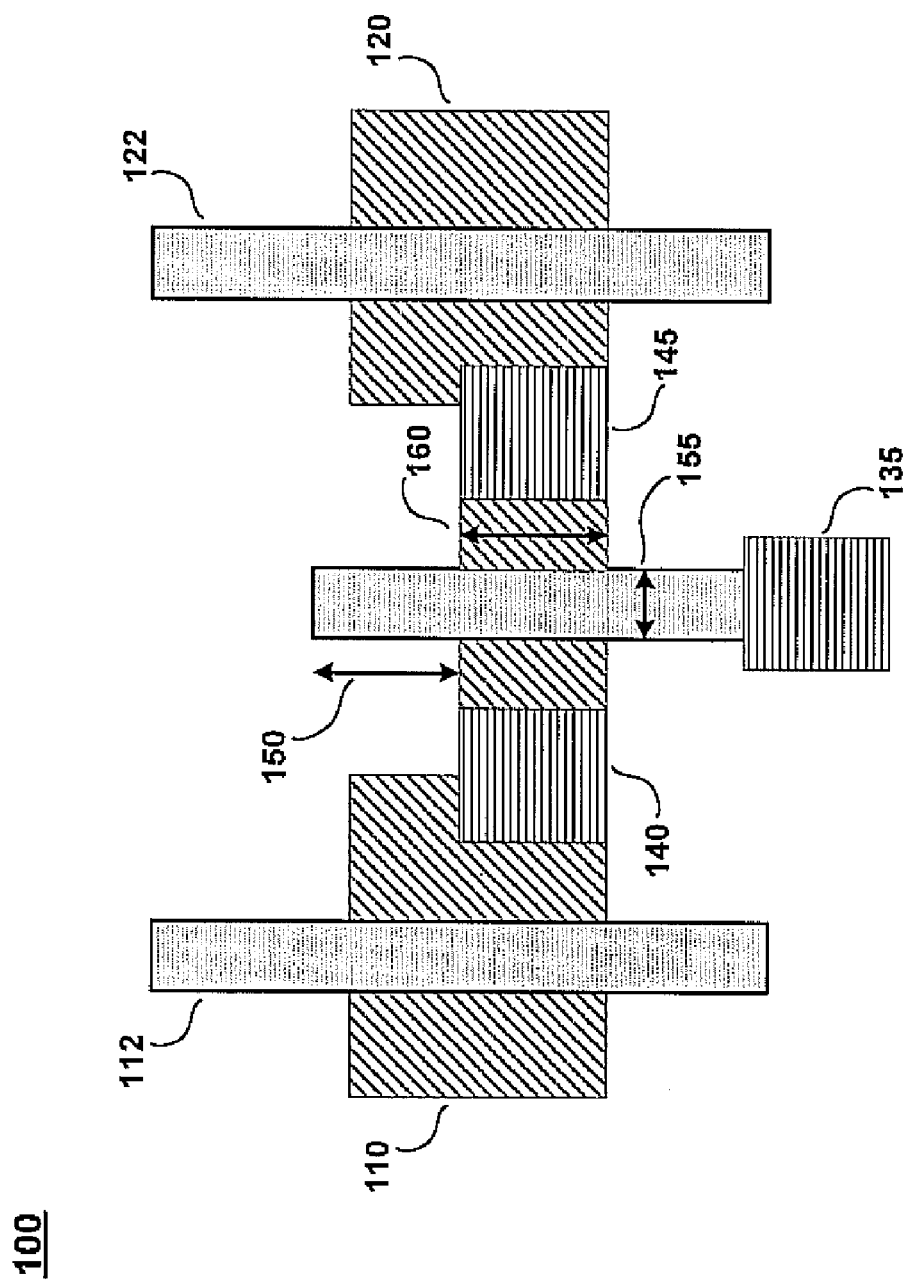
FIGS. 1, 2, 3 and 4 illustrate exemplary test structures with an increased probability of Nickel-silicide defects, in accordance with embodiments of the present invention.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions that follow (e.g., process 500) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "measuring" or "determining" or "accessing" or "analyzing" or "applying" or "grounding" or "comparing" or "sending" or "commanding" or "storing" or "computing" or "testing" or "calculating" or "measuring" or "adjusting" or "comparing" or the like, refer to the action and processes of a computer system, or similar electronic computing device" that manipulates and transforms data represented as physical (electronic) quantities within the computer system's registers and memories into other data similarly represented as physical quantities within the computer system memories or registers or other such information storage, transmission or display devices.

Nickel silicide (NiSi) is often the material of choice for silicidation in nanometer scale technologies (e.g., with a critical dimension of 65 nm or less). While the terms "silicide" or "silicidation" derive from the element name Silicon, these terms have acquired a more functional, as opposed to compositional, meaning in the semiconductor arts. The semiconductor manufacturing industry employs a variety of materials in addition to Silicon to produce "silicides." For example, a wide variety of Nickel alloys, including Nickel Platinum, may be used for silicidation. Embodiments in accordance with the present invention are well suited to all such materials used for silicidation. The use of the terms "silicide" or "silicidation" is not meant to be limiting to Silicon, but rather exemplary, as such terms are the means used by those skilled in the semiconductor processing arts to most effectively convey the substance of their work to others skilled in the art.

Systems and Methods for Detecting and Monitoring Nickel-Silicide Process and Induced Failures As with most manufacturing defects, Nickel-silicide defects in semiconductors occur at some probabilistic rate. In accordance with embodiments of the present invention, test structures are formed, e.g., on a test wafer or chip, that have a high likelihood of Nickel-silicide defects. For example, the design of such test structures include possible "pipe" defects, e.g., source or drain to well defects, or contact to gate shorts, and induce stress leakage. In addition, the test structures are designed to increase the likelihood of detecting such defects.

FIG. 1 illustrates a plan view of an exemplary test structure 100, in accordance with embodiments of the present invention. Test structure 100 may be formed with a Nickel-silicide process, and is designed to have a higher probability of Nickel-silicide defects than conventional transistor designs. Test structure 100 comprises an "L" shaped source region 110, and an "L" shaped drain region 120. More particularly, the active regions comprise a concave or "inward" corner. Such concave corners stress Nickel-silicide, and increase a probability of Nickel-silicide defects. A polysilicon line 112 runs over source region 110 and a similar polysilicon line 122 runs over drain region 120. Gate poly 130 is formed over the narrow regions of source 110 and drain 120. Test structure 100 further comprises source contact 140, drain contact 145 and gate contact 135.

FIG. 1 also illustrates several dimensions of interest for test structure 100. Dimension 150 is the length of a poly end cap for test structure 100. Dimension 160 is a gate width of test structure 100. Dimension 155 is a gate length of test structure 100.

The corners, or bends, in the active areas of test structure 100, e.g., corners of source 110 or drain 120, create stress and increase the probability of defects. Changes in dimensions 150, 155 and/or 160 vary the amount of stress in the structure and vary the probability of defects.

Figure 2:
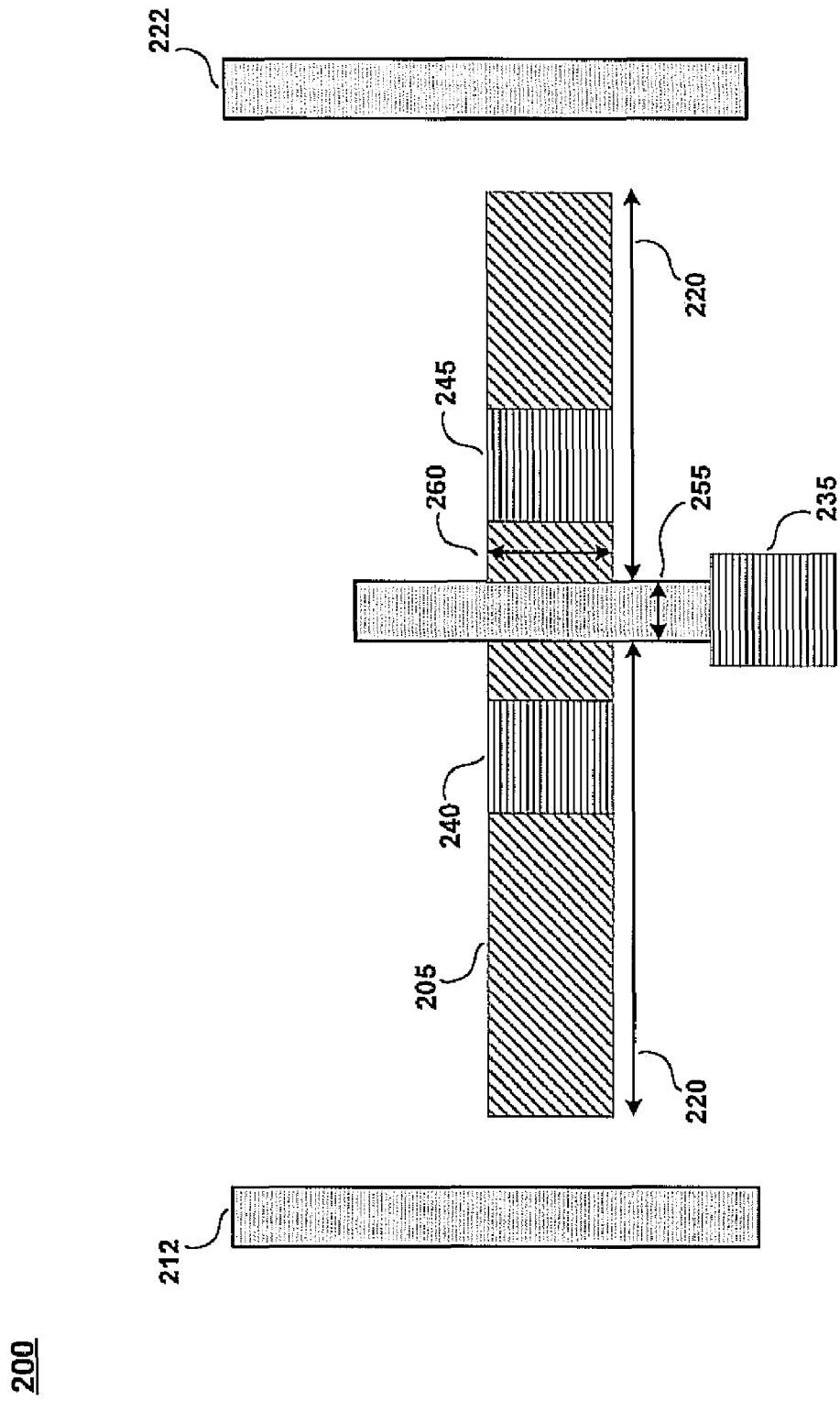

FIG. 2 illustrates a plan view of an exemplary test structure 200, in accordance with embodiments of the present invention. Test structure 200 may be formed with a Nickel-silicide process, and is designed to have a higher probability of Nickel-silicide defects than conventional transistor designs. Test structure 200 comprises a long, narrow region of active material 205, contacts 240 and 245, gate contact 235, and polysilicon lines 212 and 222. For example, the length of active material 205 is much greater than the width of active area 205. Gate poly 230 is formed over active material 205.

FIG. 2 also illustrates several dimensions of interest for test structure 200. Dimension 260 is a gate width of test structure 200. Dimension 255 is a gate length of test structure 200. Dimension 210 is a measure of the overlap of the active area on the left side of test structure 200. Similarly, dimension 220 is a measure of the overlap of the active area on the right side of test structure 200. Changes in dimensions 210, 220, 255 and/or 260 vary the amount of stress in the structure and vary the probability of defects.

Figure 3:
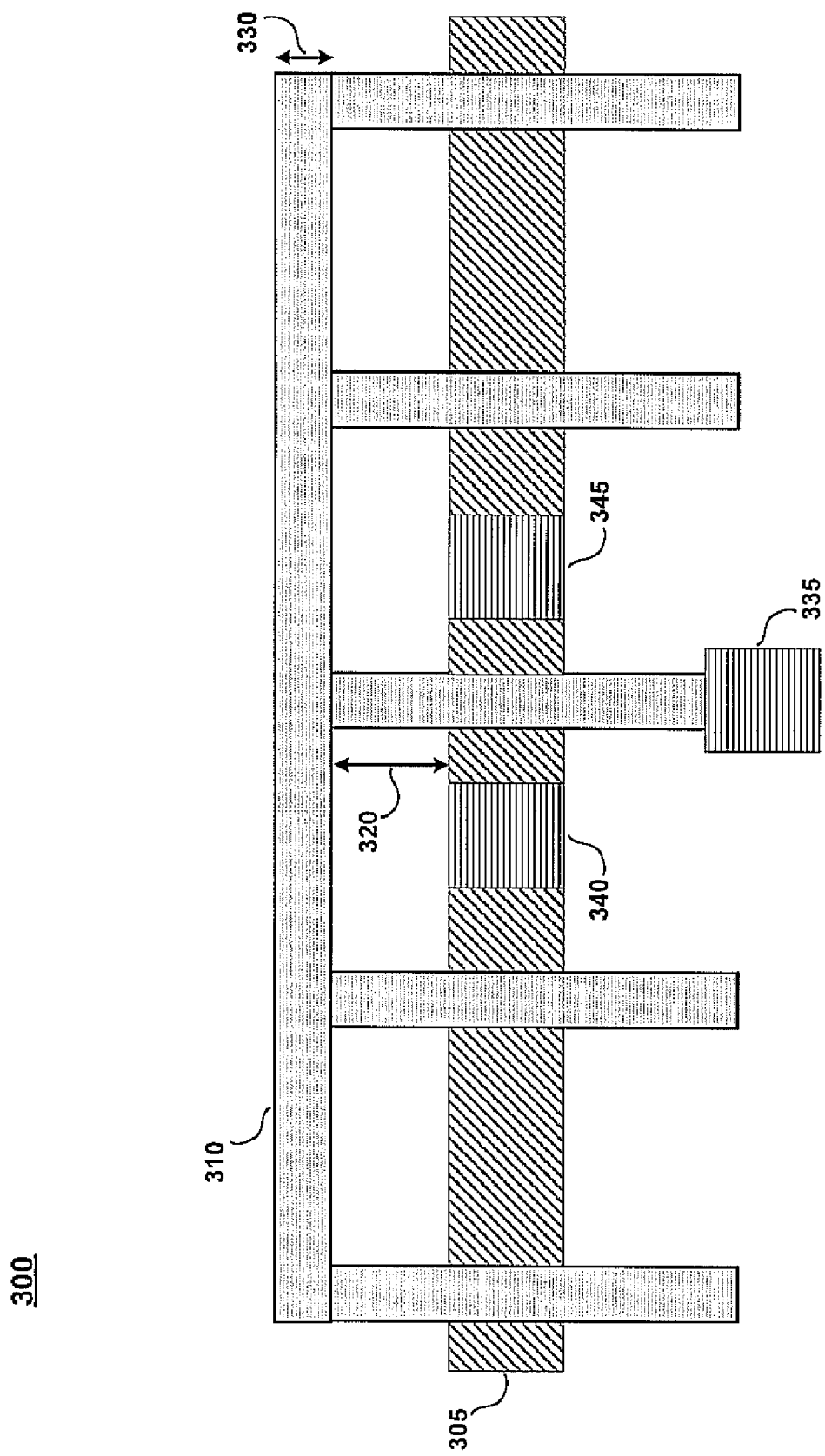

FIG. 3 illustrates a plan view of an exemplary test structure 300, in accordance with embodiments of the present invention. Test structure 300 may be formed with a Nickel-silicide process, and is designed to have a higher probability of Nickel-silicide defects than conventional transistor designs.

Test structure 300 comprises a "comb" shaped structure of polysilicon 310. The "teeth" of polysilicon 310 overlay a long, narrow region of active material 305. Test structure 300 comprises source contact 340, drain contact 345 and gate contact 335.

The proximity of the top portion of polysilicon 310 to the active material 305 forms a "notch." Such a notch induces stress in the test structure 300 and increases the probability of defects. Dimension 320 measures the length of the notch. Dimension 330 measures the width of the horizontal portion of poly 310. Changes in dimensions 310 and/or 330 vary the amount of stress in the structure and vary the probability of defects.

Figure 4:
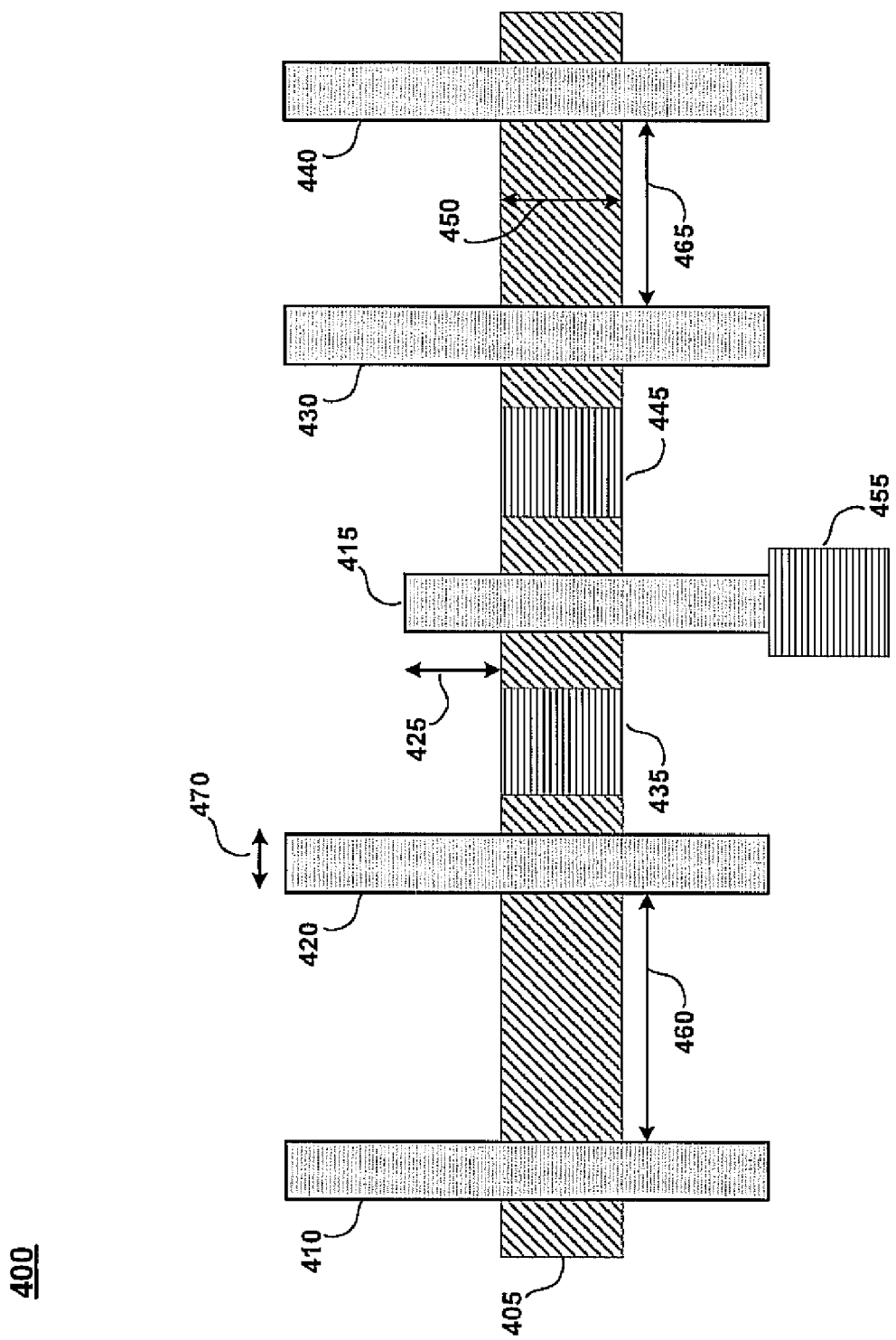

FIG. 4 illustrates a plan view of an exemplary test structure 400, in accordance with embodiments of the present invention. Test structure 400 may be formed with a Nickel-silicide process, and is designed to have a higher probability of Nickel-silicide defects than conventional transistor designs.

Test structure 400 comprises a long, narrow region of active material 405, polysilicon structures 410, 420, 430, 440 and 415 formed over active material 405, source contact 435, drain contact 445 and gate contact 455.

FIG. 4 also illustrates several dimensions of interest for test structure 400. Dimension 425 measures the length of a poly end cap. Dimension 450 measures a gate width. Dimension 470 measures a gate length. Dimension 460 measures the spacing between the two leftmost poly lines. Similarly, dimension 465 measures the spacing between the two rightmost poly lines.

With particular respect to dimensions 460 and/or 465, if these dimensions are relatively small, e.g., the two poly lines are very close, a spacer, usually made of nitride, is generally formed between the two poly lines. A contact etch stop layer is also frequently used between closely spaced poly lines. Nitride and/or a contact etch stop layer contribute very high levels of stress to the test structure, and increase a probability of defects.

In contrast, when dimensions 460 and/or 465 are relatively great, e.g., the two poly lines are far apart, a stress layer fills in the region between the poly lines, inducing stress and increasing a probability of defects. Changes in dimensions 460, 470, 450, 425 and/or 465 vary the amount of stress in the structure and vary the probability of defects.

As previously described, Nickel-silicide defects occur at some probabilistic rate. For example, Nickel-silicide defect rates may range from the order of one defect per $10^3$ structures, e.g., a transistor, to one defect per $10^7$ structures. Consequently, for any given single structure, the likelihood of a failure is low. While forming a large number of structures may increase the likelihood of a failure, it is impractical to test a large number of individual structures, e.g., transistors, as each structure would require multiple pads, e.g., gate, source, drain, etc., to allow external access to the structure for testing. It is appreciated that input/output (I/O) pads on an integrated circuit device are very limited.

Figure 5:
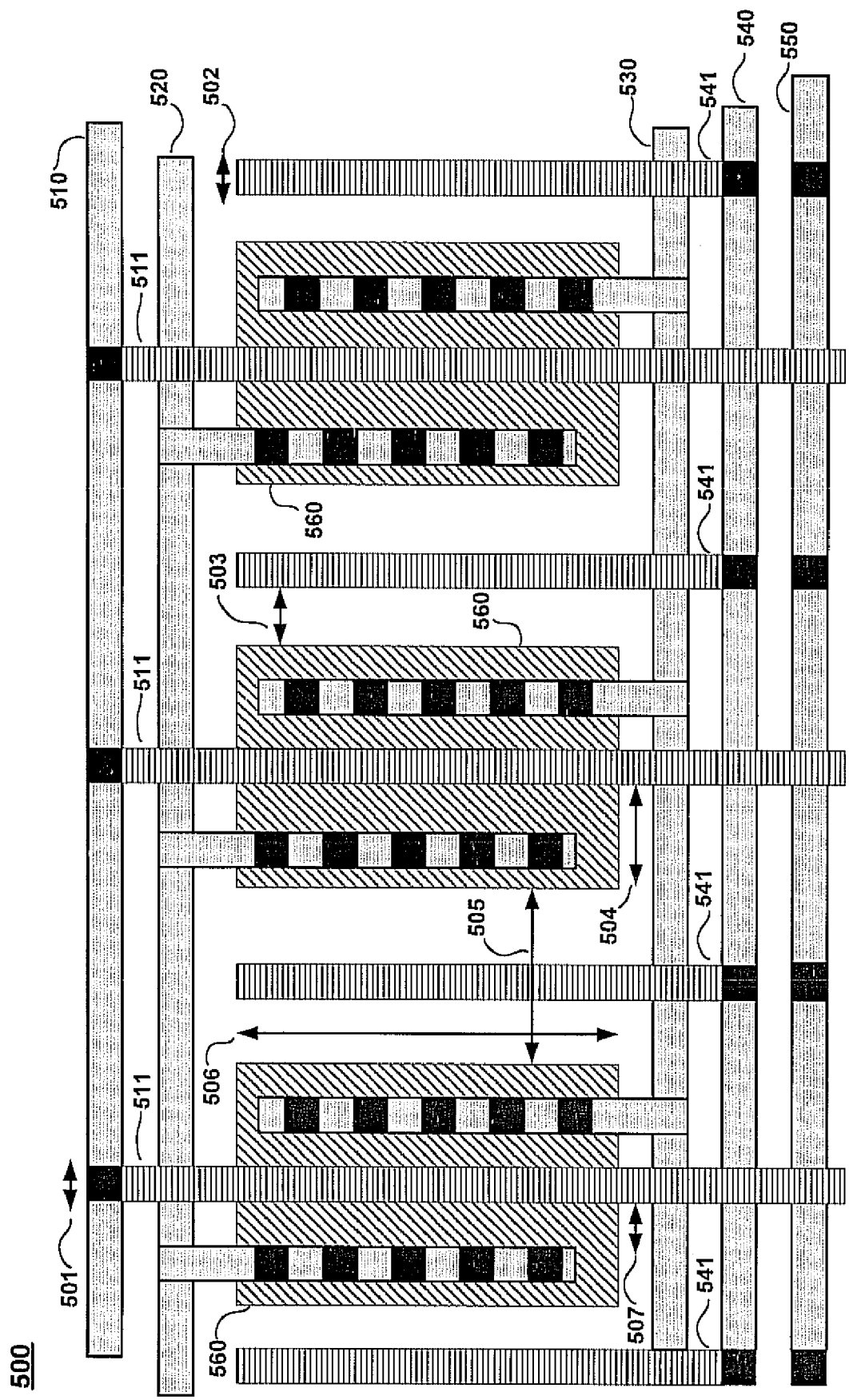
FIG. 5 illustrates a plan view of a portion of an exemplary test structure of parallel transistors, in accordance with embodiments of the present invention.

In accordance with embodiments of the present invention, a large number of transistors are formed in parallel, as illustrated in FIG. 5. Advantageously, the large number of devices increases a probability of defects. Beneficially, since the transistors are coupled in parallel, relatively few pads, e.g., 5, are required to access and measure characteristics of the plurality of parallel transistors.

FIG. 5 illustrates a plan view of a portion of an exemplary test structure 500 of parallel transistors, in accordance with embodiments of the present invention. Test structure 500 may be formed with a Nickel-silicide process. FIG. 5 illustrates only three transistors. A typical embodiment may have many thousands of parallel transistors.

Test structure 500 includes a gate bus 510, gate poly lines 511, a source bus 520, a drain bus 530, a field poly bus 540 and field poly lines 541 and a well bus 550. Contacts are indicated as filled black squares, but are not assigned identifying numerals for clarity. The sources, drains and gate poly regions pass over active areas 560.

FIG. 5 also illustrates several dimensions of interest for test structure 500. Dimension 501 measures a gate length of gates in test structure 500. Dimension 502 measures a width of field poly lines in test structure 500. Dimension 503 measures the distance between a field poly line, e.g., field poly line 541, and an active area, e.g., active area 560, in test structure 500. Dimension 504 measures an active area extension in test structure 500. Dimension 505 measures a distance between active areas in test structure 500. Dimension 506 measures a gate width of gates in test structure 500. Dimension 507 measures a distance from contacts, e.g., on source bus 520, to a gate, e.g., gate 511, in test structure 500. Changes in dimensions 501, 502, 503, 504, 505, 506 and/or 507 vary the amount of stress in the structure and vary the probability of defects.

In accordance with embodiments of the present invention, test structure 500 may comprise multiple instances of test structures 100, 200, 300 or 400. Generally, test structure 500 would contain only one type of test structure, although embodiments in accordance with the present invention are not so limited.

In accordance with embodiments of the present invention, a test wafer or chip may comprise a chain of a large number, e.g., 5 to 50 thousand, transistors in parallel, as described in FIG. 5. The appropriate number of transistors is a function of the defect free leakage current versus leakage current under fault conditions. For example, two orders of magnitude between fault free leakage current and leakage current under fault conditions may enable identification of a small number of faults among a large number of defect free structures. All transistors will generally be substantially identical, e.g., they have the same design. For example, every transistor is similar to test structure 100, and has the same dimensions.

In addition, in accordance with embodiments of the present invention, a test wafer or chip may comprise a group of multiple chains of similar test structures, with varying dimensions. For example, a test chip comprises five chains of test structures similar to test structure 100. However, each chain is characterized as having transistors of different dimensions from the transistors of the other chains.

Further, in accordance with embodiments of the present invention, a test wafer or chip may comprise multiple groups of chains of test structures. Each group of, e.g., five, chains may be based on a different test structure. For example, five chains of a first group are based on test structure 100, five chains of a second group are based on test structure 200, etc. Each chain within a group is based on a common test structure design; however, each chain has different dimensions with respect to the common test structure design.

It is appreciated that multiple groups of the same test structure may be constructed, in order to create a total number of test structures corresponding to an expected failure rate. For example, a low expected failure rate would generally require a high number of test structures, and may require replication of similar or identical groups to construct enough transistors to have a relatively high probability of observing a particular defect mode.

Figure 6:
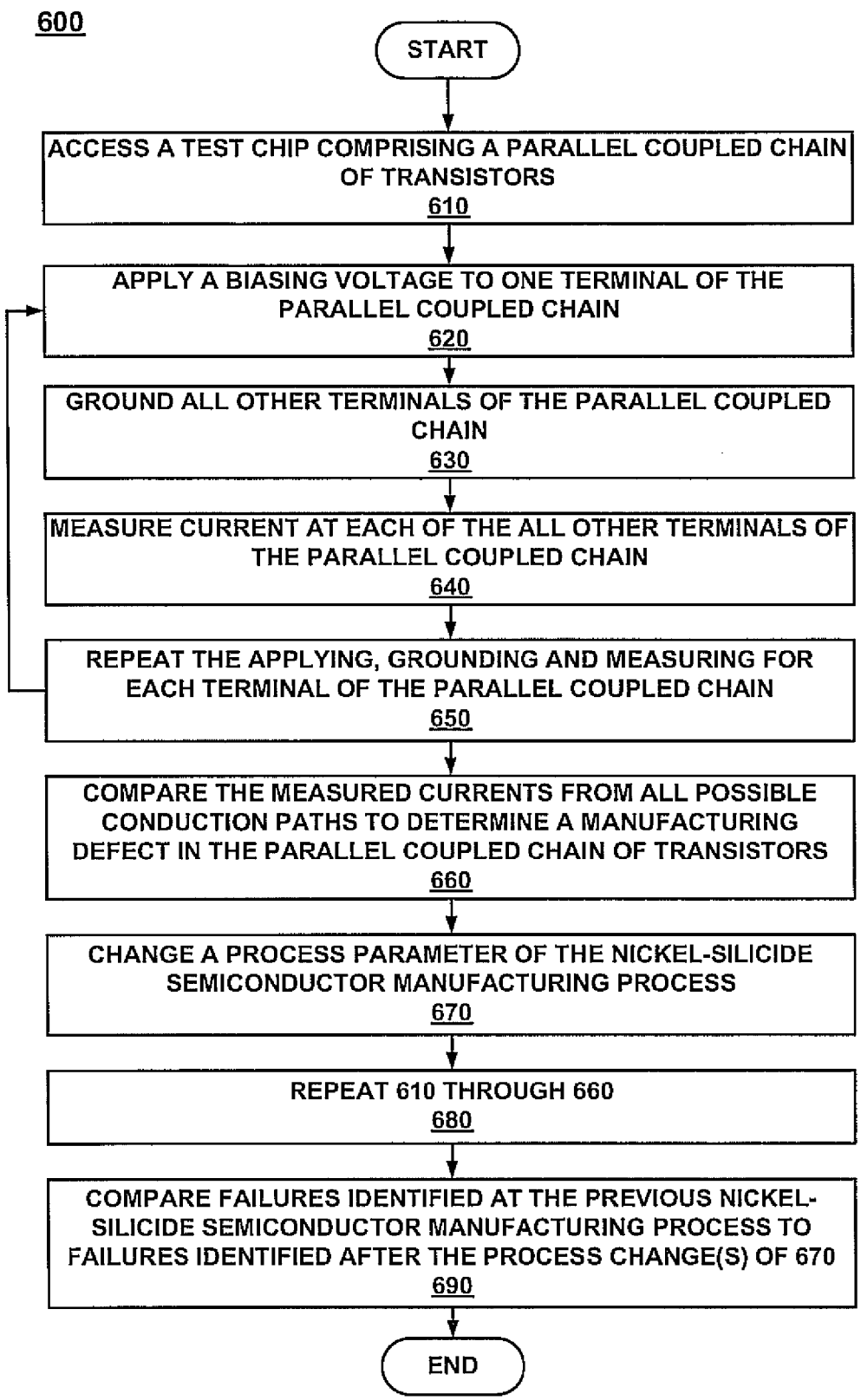
FIG. 6 illustrates an exemplary computer-implemented method for characterizing a Nickel-silicide semiconductor manufacturing process, in accordance with embodiments of the present invention.

FIG. 6 illustrates an exemplary computer-implemented method 600 for characterizing a Nickel-silicide semiconductor manufacturing process, in accordance with embodiments of the present invention. In 610 a test chip comprising a parallel coupled chain of transistors is accessed, e.g., by a computer-controlled integrated tester. The transistors are designed for inducing stress into Nickel-silicide features of the transistors, and for increasing a probability of a manufacturing failure of the Nickel-silicide features.

In 620, a biasing voltage, e.g., at Vdd, is applied to one terminal of the parallel coupled chain, e.g., source terminal 520 of test structure 500 (FIG. 5). In 630, all other terminals of the parallel coupled chain are grounded.

Optionally, the drain and source may be treated as a single terminal. For example, the drain and source may both be biased, and the remaining terminals, e.g., gate, field poly and well terminals grounded, and current measured at those terminals. Alternatively, current flowing from the source and the drain terminals may be combined. Treating the drain and source as a single terminal may also be combined with treating the drain and source terminals individually. For example, configurations may include a source terminal biased and all other terminals grounded, a drain terminal biased, and all other terminals grounded, as well as the drain and source biased to the same voltage, with the remaining terminals grounded.

In 640, current is measured at each of the all other terminals of the parallel coupled chain. In 650, the applying, grounding and measuring for each terminal of said parallel coupled chain are repeated.

In 660, the measured currents from all possible conduction paths are compared to determine a manufacturing defect in said parallel coupled chain of transistors. For example, an asymmetry among measured currents may indicate a location of said manufacturing defect.

In optional 670, a process parameter of said Nickel-silicide semiconductor manufacturing process may be changed. In optional 680, 610 through 660 are repeated.

In option 690, failures identified at the previous Nickel-silicide semiconductor manufacturing process are compared to failures identified after the process change(s) of 670.

Figure 7A:
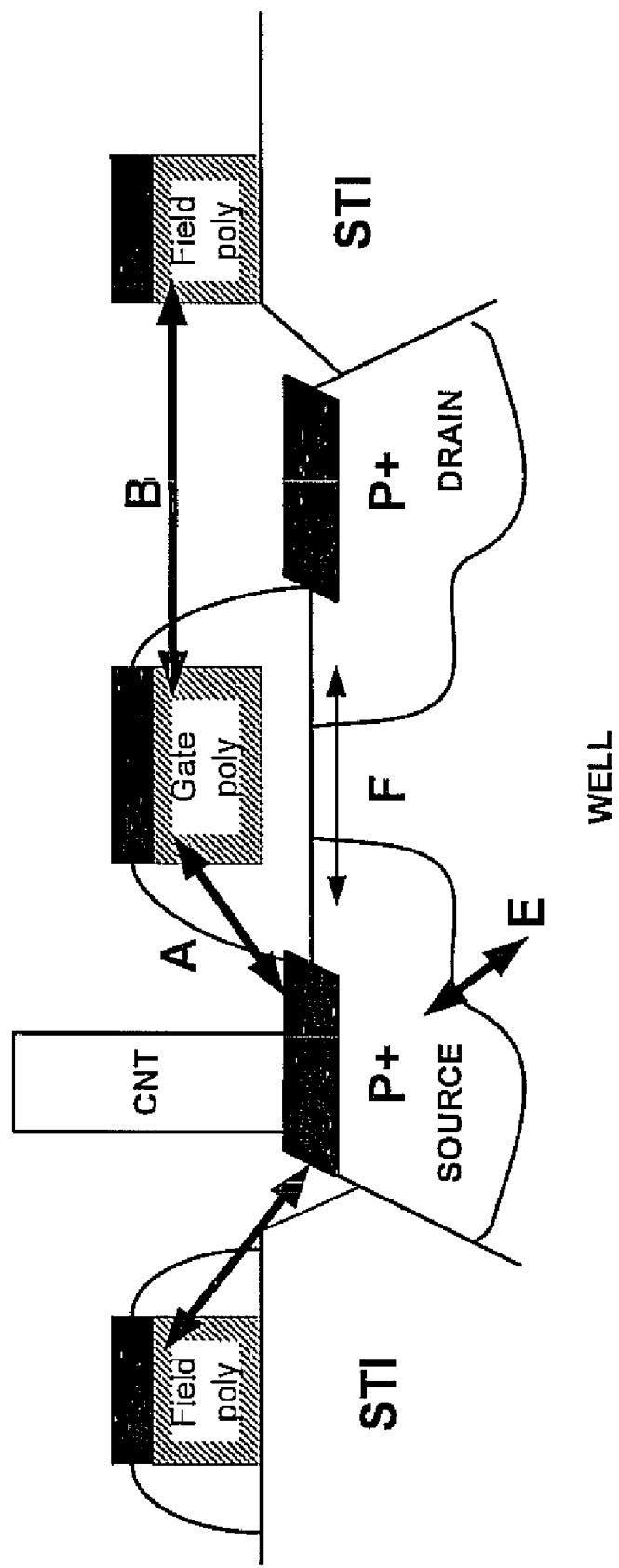
FIG. 7A illustrates a side sectional view of a transistor and some of the potential leakage paths that may be measured, in accordance with embodiments of the present invention.

FIG. 7A illustrates a side sectional view of a transistor and some of the potential leakage paths that may be measured by process 600, in accordance with embodiments of the present invention. It is appreciated that leakage current is potentially bidirectional. Leakage path A is between a gate and a source. Leakage path B is between a gate and a field polysilicon line. Leakage path D is between a source and a field polysilicon line. Leakage path E is between a source and a well. Leakage path F is between a source and a drain. It is to be appreciated that leakage paths A', D' and E' (not shown) also exist, in which a drain terminal is substituted for a source terminal. For example, leakage path A' is between a gate and a drain. "STI," on the left and right of FIG. 7A, represents shallow trench isolation structures.

FIG. 7B illustrates a configuration table 750 of measured currents versus biased terminal, in accordance with embodiments of the present invention. The measured results are indicated in the form "BIm," where "B" is the biased terminal, "I" stands for current and "m" is the terminal at which current is measured. For example, the entry "SId" indicates that a source terminal ("S") is biased, the drain, field poly, gate and well terminals are grounded, and drain ("d") current is measured.

In accordance with embodiments of the present invention, current measurement data, in accordance with process 600 and the configuration table 750 of FIG. 7B may be used to identify the location of Nickel-silicide defects.

Figure 8:
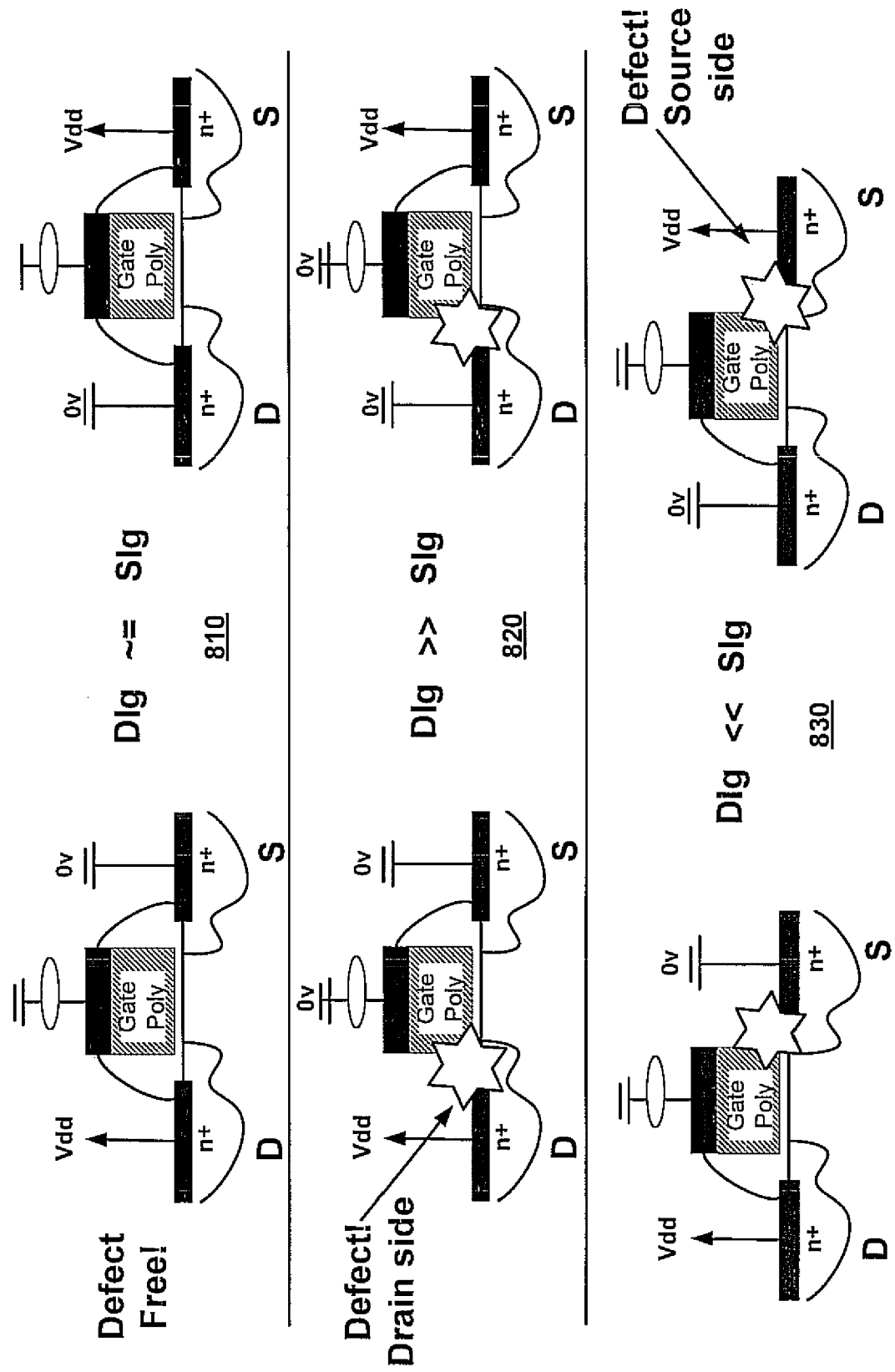
FIG. 8 illustrates three exemplary relationships among current measurements, in accordance with embodiments of the present invention.

FIG. 8 illustrates three exemplary relationships among current measurements, in accordance with embodiments of the present invention. On the left of relationship 810, the drain terminal is biased, the remaining terminals are grounded, and current is measured at the gate. This is the "DIg" configuration illustrated in FIG. 7B. On the right of relationship 810, the source terminal is biased, the remaining terminals are grounded, and current is measured at the gate. This is the "SIg" configuration illustrated in FIG. 7B. As illustrated in relationship 810, "DIg" current is approximately equal to "SIg" current. Thus, there are no defects affecting source to gate or drain to gate leakage.

In relationship 820, "DIg" current is much greater than "SIg" current. This relationship of the two current measurements indicates a defect on the drain side of the test structure. In relationship 830, "DIg" current is much less than "SIg" current. This relationship of the two current measurements indicates a defect on the source side of the test structure.

Figure 9:
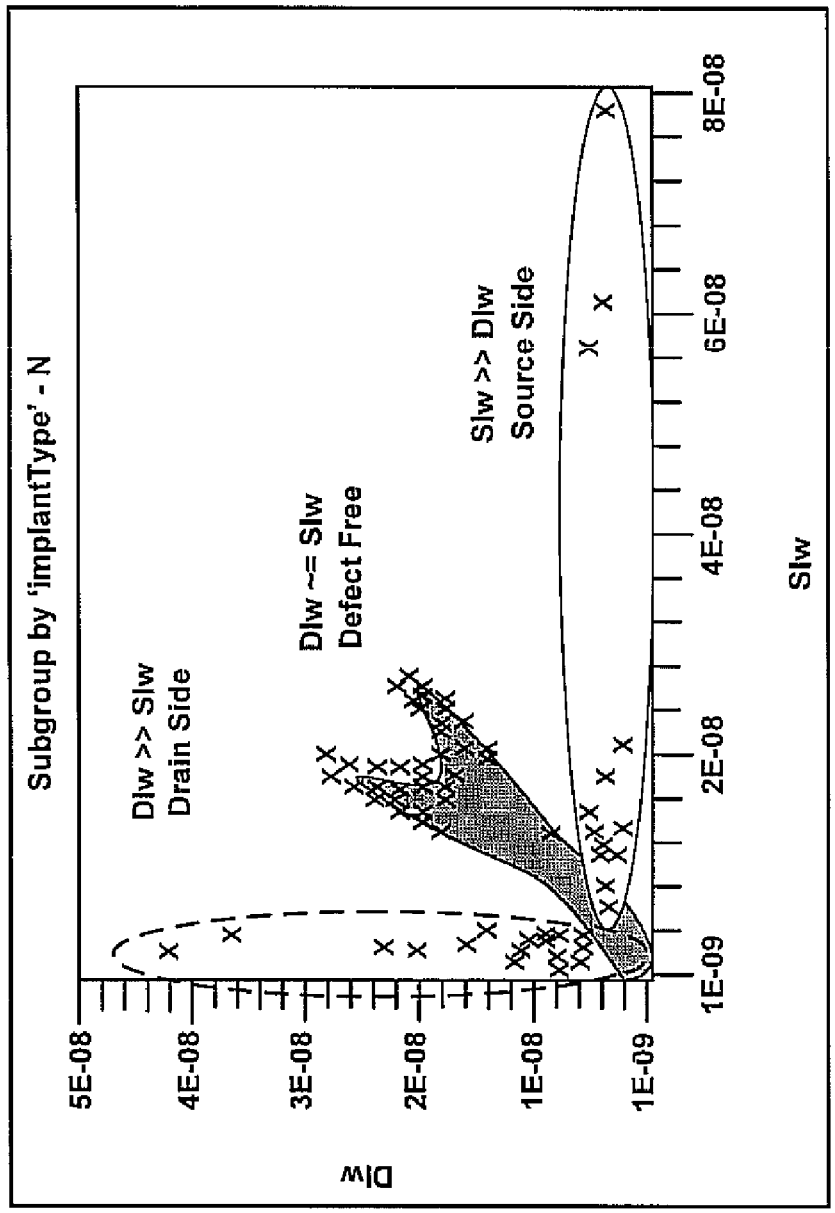
FIG. 9 illustrates a plot of a first measured leakage current versus a second measured leakage current, for a large sample of test structures, in accordance with embodiments of the present invention.

FIG. 9 illustrates a plot 900 of "DIw" current versus "SIw" current, for a large sample of test structures, in accordance with embodiments of the present invention. Plot 900 shows about 12 measurements in which "SIw" is much greater than "DIw," indicating a defect on the source side. In addition, plot 900 shows about 20 measurements in which "SIw" is much less than "DIw," indicating a defect on the drain side. Plot 900 further indicates a large number of measurements in which "SIw" is about equal to "DIw." For those test structures, there are no defects associated with the "SIw" or "DIw" measurements.

Some adjustments to a manufacturing process to minimize silicide leakage, e.g., making the silicide thinner, may detrimentally increase resistance. It may be useful to characterize the effects of such adjustments.

Figure 10:
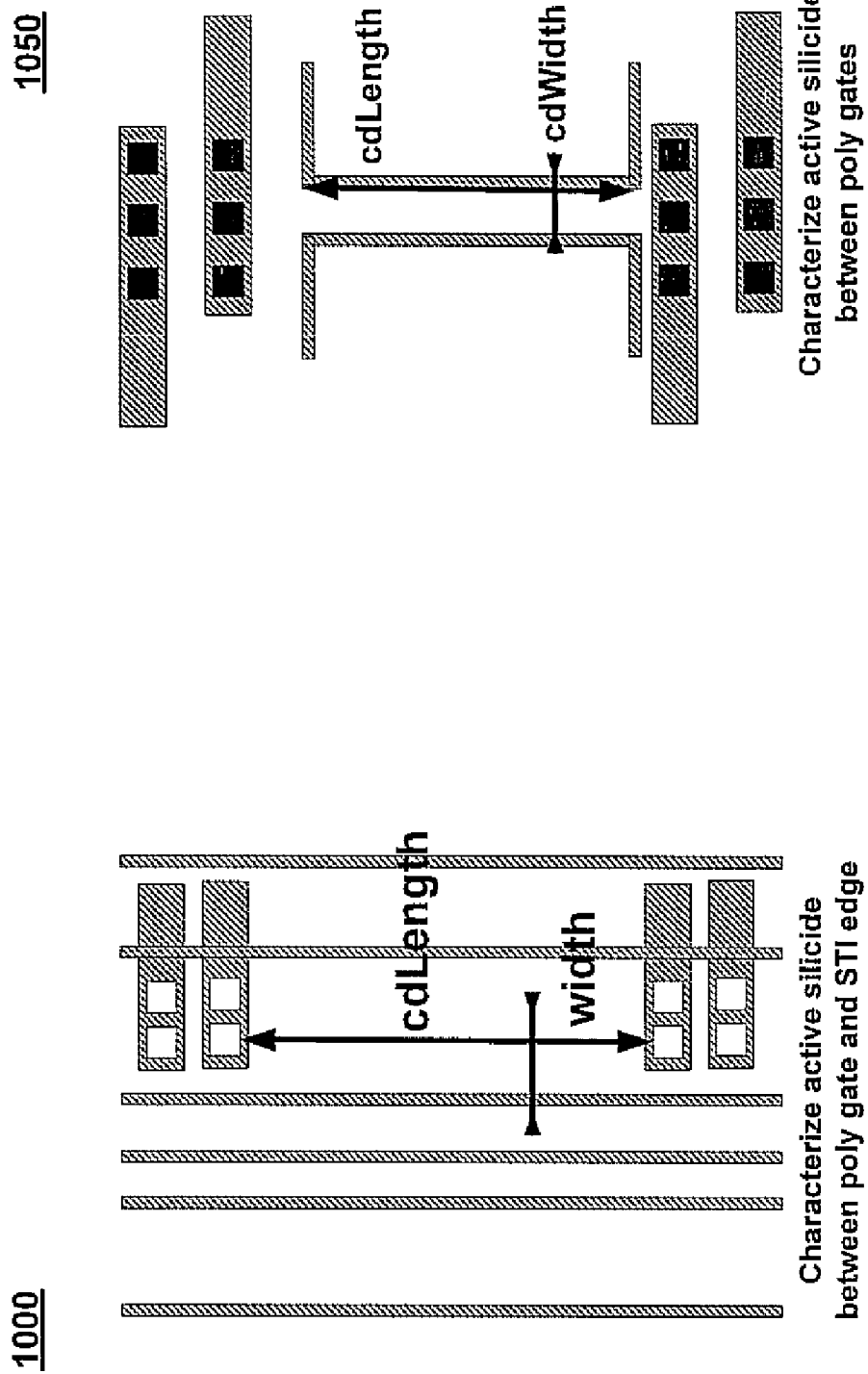
FIG. 10 illustrates two test structures that are useful for monitoring a variety of silicide characteristics, in accordance with embodiments of the present invention.

FIG. 10 illustrates two test structures 1000 and 1050 that are useful for monitoring a variety of silicide characteristics, in accordance with embodiments of the present invention. Such characteristics may not inherently be defects, and may not be detected by the structures and methods previously described herein.

A basic characteristic of a silicide process is the quality (or lack thereof) of narrow lines. Test structures 1000 and 1050 comprise active silicide next to a poly gate. These test structures enable characterization of silicide resistance in narrow active regions, characterization of active silicide in a source/drain environment, and enable a comparison with a comparable active area width without a poly gate neighbor.

The "cdLength" and "width" dimensions are related to the resistance of the structures. By varying these dimensions and measuring resistance for each variation, a "roll off" curve may be generated, plotting change in resistance versus dimension changes. Thus, while making process changes to improve leakage defects, test structures 1000 and 1050 enable monitoring of other important characteristics of silicide.

Figure 11:
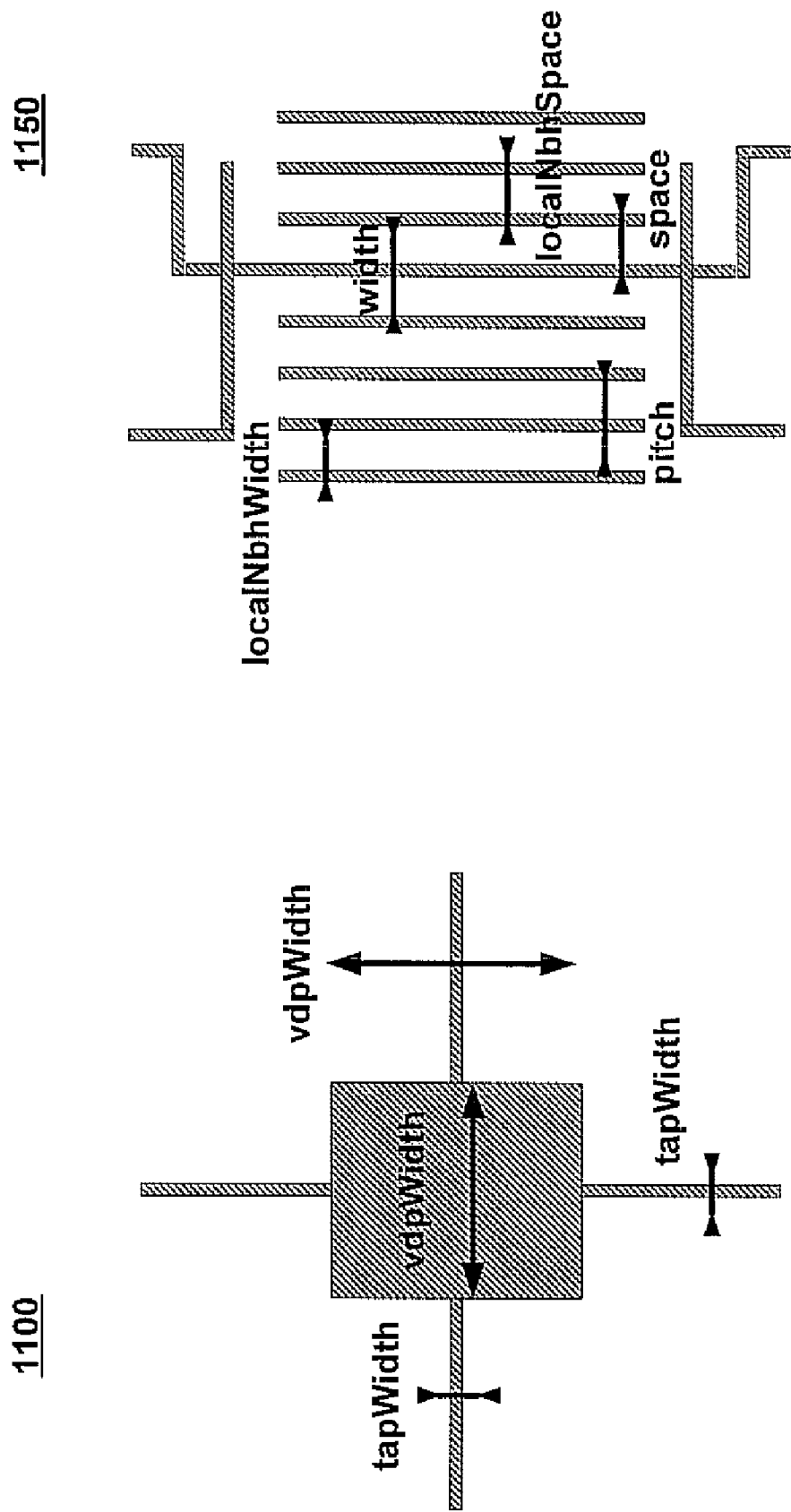
FIG. 11 illustrates two additional test structures that are useful for monitoring a variety of silicide characteristics, in accordance with embodiments of the present invention.

FIG. 11 illustrates two test structures 1100 and 1150 that are useful for monitoring a variety of silicide characteristics, in accordance with embodiments of the present invention. As with the test structures 1000 and 1050 of FIG. 10, such characteristics may not inherently be defects, and may not be detected by the structures and methods previously described herein.

Test structures 1100 and 1150 are useful for characterizing basic sheet resistance. They may be used to directly measure and monitor sheet resistance as various process parameters are adjusted. Test structures 1100 and 1150 may identify reverse narrow width effects, and may also be utilized to characterize N-type versus P-type sheet resistance.

The "tapWidth," "vdpWidth," "localNbhWidth," "width," "localNbhSpace," "pitch" and "space" dimensions are related to the resistance of the structures. By varying these dimensions and measuring resistance for each variation, a "roll off" curve may be generated, plotting change in resistance versus dimension changes. Thus, while making process changes to improve leakage defects, test structures 1100 and 1150 enable monitoring of these important characteristics of silicide.

Advantageously, these novel systems and methods enable electrical measurement of stress-induced Nickel-silicide leakage and/or defects. Beneficially, such electrical measurements may be performed with very large throughput, for example using commercially available high speed, highly parallel electrical parametric testers, such as the pdFasTest™ parametric tester, commercially available from PDF Solutions, Inc., of San José, Calif. Further, such measurements may be made for structures beneath a layer of silicon that were previously invisible to optical inspection techniques.

Also of advantage, the basic test structure is a chain, which is a common structure in integrated circuits. Further, because the chain test structure comprises large numbers of transistors, current and resistance measurements are highly stable and are relatively insensitive to process variation.

Embodiments in accordance with the present invention provide for systems and method for detecting and monitoring Nickel-silicide process and induced failures. Embodiments in accordance with the present invention also provide for systems and methods for integrated circuit structures with increased probability of Nickel-silicide failures, which also satisfies the above need. Additional embodiments in accordance with the present invention provide for systems and methods for detecting Nickel-silicide failures on an integrated circuit, which also satisfies the above needs. Further embodiments in accordance with the present invention provide for systems and method for detecting and monitoring Nickel-silicide process and induced failures that are compatible and complementary with existing systems and methods of multi-layer photolithographic manufacturing and test of semiconductors.

Various embodiments of the invention are thus described. While the present invention has been described in particular embodiments, it should be appreciated that the invention should not be construed as limited by such embodiments, but rather construed according to the below claims.

What is claimed is:

1. A method of characterizing a Nickel-silicide semiconductor manufacturing process comprising:
    accessing a test chip comprising a parallel coupled chain of transistors, wherein said transistors are designed for inducing stress into Nickel-silicide features of said transistors, and for increasing a probability of a manufacturing failure of said Nickel-silicide features;
    applying a biasing voltage to one terminal of said parallel coupled chain;
    grounding all other terminals of said parallel coupled chain;
    measuring current at each of said all other terminals of said parallel coupled chain;
    repeating said applying, grounding and measuring for each terminal of said parallel coupled chain;
    comparing measured currents from all possible conduction paths to determine a manufacturing defect in said parallel coupled chain of transistors;
    changing a process parameter of said Nickel-silicide semiconductor manufacturing process; and
    repeating said accessing, said applying, said grounding, said measuring, said repeating said applying, grounding and measuring and said comparing.

2. The method of claim 1 wherein an asymmetry among measured currents indicates a location of said manufacturing defect.

3. The method of claim 1 further comprising comparing failures identified at the previous Nickel-silicide semiconductor manufacturing process to failures identified after said changing said process parameter.

4. A method of changing a Nickel-silicide semiconductor manufacturing process comprising:
    accessing a test chip comprising a parallel coupled chain of transistors, wherein said transistors are designed for inducing stress into Nickel-silicide features of said transistors, and for increasing a probability of a manufacturing failure of said Nickel-silicide features;
    applying a biasing voltage to one terminal of said parallel coupled chain;
    grounding all other terminals of said parallel coupled chain;
    measuring current at each of said all other terminals of said parallel coupled chain;
    repeating said applying, grounding and measuring for each terminal of said parallel coupled chain;
    comparing measured currents from all possible conduction paths to determine a manufacturing defect in said parallel coupled chain of transistors;
    changing a process parameter of said Nickel-silicide semiconductor manufacturing process;
    second repeating said accessing, applying, grounding, measuring, repeating and comparing; and
    second comparing failures identified at first said Nickel-silicide semiconductor manufacturing process to failures identified after said changing.

5. The method of claim 4 further comprising accessing additional test structures on said test chip for monitoring non-defect behavior of said Nickel-silicide semiconductor manufacturing process.

6. The method of claim 5 wherein said additional test structures comprise test structures for measuring sheet resistance of said Nickel-silicide semiconductor manufacturing process.

7. The method of claim 5 wherein said additional test structures comprise test structures for identifying polysilicon shadowing effects of said Nickel-silicide semiconductor manufacturing process.

8. The method of claim 5 wherein said additional test structures comprise test structures for increasing stress by reducing transistor width below process design rule minimums.

* * * * *